(12) United States Patent
Chau

(10) Patent No.: US 6,375,365 B1
(45) Date of Patent: Apr. 23, 2002

(54) APPARATUS AND PACKAGING METHOD TO ASSEMBLE OPTICAL MODULES TO A COMMON SUBSTRATE WITH ADJUSTABLE PLUGS

(75) Inventor: Kelvin Chau, Pleasanton, CA (US)

(73) Assignee: Onix Microsystems, Inc., Richmond, CA (US)

( * ) Notice: Subject to any disclaimer, the term of this patent is extended or adjusted under 35 U.S.C. 154(b) by 0 days.

(21) Appl. No.: 09/514,424

(22) Filed: Feb. 28, 2000

(51) Int. Cl.[7] .................................................. G02B 6/36
(52) U.S. Cl. .......................................... 385/88; 385/14
(58) Field of Search ................................ 385/88–94, 14

(56) References Cited

U.S. PATENT DOCUMENTS

| | | | |
|---|---|---|---|
| 4,758,263 A | | 7/1988 | Konechny .................. 350/96.2 |
| 5,247,597 A | * | 9/1993 | Blacha et al. ................. 385/88 |
| 5,611,006 A | * | 3/1997 | Tabuchi ........................ 385/14 |
| 5,864,642 A | | 1/1999 | Chun et al. ..................... 385/14 |

* cited by examiner

Primary Examiner—Phan T. H. Palmer
(74) Attorney, Agent, or Firm—JDI Patent; Joshua D. Isenberg

(57) ABSTRACT

For any optically interconnected assembly, the packaging tasks include alignment of one or multiple optical devices, and attachment of aligned modules to a common substrate. The concept disclosed here is a packaging method to assemble pre-aligned optical modules on a common structure called motherboard. The apparatus consists of two components: device carrier or motherboard with openings on the sides and adjustable plugs in the form of pins or balls. The method and apparatus utilize plugs as connection bridges between device carriers and motherboard, allowing solid contacts and a rigid aligned structure among modules. The direct benefits include relaxation of dimensional tolerances on parts and elimination of the need for high-precision spacers.

26 Claims, 5 Drawing Sheets

APPARATUS AND PACKAGING METHOD TO ASSEMBLE OPTICAL MODULES TO A COMMON SUBSTRATE WITH ADJUSTABLE PLUGS

FIELD OF THE INVENTION

This invention relates generally to assembly of optical modules. More particularly, it relates to a mechanism for packaging optically interconnected assemblies requiring of structural stability and precision alignment by using adjustable plugs.

BACKGROUND ART

For most optoelectronic products manufactured today, coupling light into or out of an optical device is accomplished by active alignment of one device with respect to another. The basic process is to move an object in space angularly and laterally to locate a first device (X,Y,Z) and orient ($\theta_x$, $\theta_y$, $\theta_z$) it with respect to a second device. The device can be held either by mechanical clamp or suction generated by vacuum pump. Special toolings are usually made for particular geometry.

To maintain alignment, the first device has to be permanently fixed on a motherboard. The challenge is to find a suitable mounting technique that will allow sufficient angular and lateral offset as the fixture secured to a motherboard. There are usually arbitrary gaps formed between bonding surfaces of the optical device and the motherboard, as depicted in FIG. 1 of prior art, due to physical impression of parts. In FIG. 1, a first optical device is aligned respect to a second optical device to couple the light into or out of these optical devices. The gap between surface 1 of the first device and surface 2 of the motherboard is formed. These gaps inhibit the aligned assembly from being assembled with solid contacts.

FIGS. 2, 3, and 4 demonstrate various prior art assembly concepts to compensate for such angular and lateral deviations. Typical solutions involve the use of thick epoxy and/or solder and precision spacers. FIG. 2 shows the gap between two bonding surfaces is filled with epoxy. The problem with this approach is that epoxy shrinks during curing. The resulting dislocation could be significant if the gap is large. This shrinkage is generally predictable and could be accounted for in final assembly. However, this can make the assembly process complicated and often unreliable. FIG. 3 depicts enhanced approach that uses a spacer to reduce the overall gap between the optical device and the motherboard. A layer of epoxy fills the subgap between the optical device and the spacer. The thickness of the spacer has to be precise to properly align the first device with respect to the second. Furthermore, shrinkage of the epoxy during curing is still a problem. Another approach, shown in FIG. 4, is to use a solder bump, allowing two surfaces to be bonded with solder reflow at high temperature. Although many advantages of this technology have been realized: high yield, high strength and self-alignment during joining, the initial setup cost is extremely high. Furthermore, the device is not secured to the motherboard during solder reflow and may become misaligned as the solder solidifies. In addition, the solder bump may not be able to withstand large temperature fluctuations due to differences in the coefficients of thermal expansion of the bonding materials. The problem becomes aggravated as the size of solder becomes larger.

There is a need, therefore, for a low cost packaging method to assemble pre-aligned optical modules to a common substrate, by which the optical modules are permanently fixed on the common substrate without dislocation due to temperature variations.

OBJECTS AND ADVANTAGES

Accordingly, it is a primary object of the present invention to provide an actively alignable optoelectronic package having high performance characteristics and low manufacturing cost.

It is a further object of the present invention to reduce the requirement of dimensional tolerances on parts or completely eliminate the need for precision spacers.

It is an additional object of the invention to prevent the shrinkage of epoxy in the gap between the bonding surfaces during temperature variations.

It is another object of the present invention to provide a solution to compensate any arbitrary lateral and angular misfits during final mounting.

It is another object of the present invention to use plugs as an adjustable spacer between device carriers and motherboard to compensate possible misalignment.

It is an additional object of the present invention to provide solid contacts and create a rigid aligned structure between modules.

SUMMARY

These objects and advantages are attained by apparatus and packaging methods to assemble optical modules to a common substrate with adjustable plugs.

In accordance with a first embodiment of the present invention, the apparatus for attachment and alignment optical devices to a motherboard comprises a device carrier, at least three adjustable plugs, and a filler material. The plugs are configured to fit into openings in the device carrier or the motherboard. A filler material, such as epoxy or solder, fills the space between the device carrier and the motherboard. The device carrier has one or more sides containing the openings. The plugs are typically in the form of the pins or balls with the cross-sections providing maximum contact area such as round or square cross-sections.

The device carrier and the plugs are generally made from materials with low thermal expansion such as aluminum, ceramic, hardened steel, glass, or silicon. These materials will not expand or contract much with the temperature fluctuations, so the overall thermal performance is enhanced. To enhance soldering technique, the plugs could also be plated for soldering or are made from the soldering materials such as tin-lead and gold-tin.

According to a second embodiment of the present invention, a method is set forth for attachment and alignment optical devices to a motherboard to compensate any arbitrary lateral and angular misalignment during the final mounting. In this method, at least three through holes are provided in the device carrier. The plugs are inserted through the holes from the top of the device carrier. The device carrier is aligned spatially and angularly relative to the motherboard. The plugs are tacked to the motherboard and the device carrier to secure the alignment of the device. The filler material fills the gap between the device carrier and the motherboard. The filler material and the plugs secure the device carrier to the motherboard. The plugs and the holes have cross-sections that provide maximum contact area such as square/square cross-sections or round/round cross-sections. The plugs closely fit into the holes, so the clearance is large enough for plugs to slip through the holes without much insertion force. Through holes are provided in the assembly to confine epoxy or solder at the joints between the device carrier and the plugs and form a channel for plugs to slide up and down during movement of the device carrier relative to the motherboard. In this method, the plugs are used as an adjustable spacer between the device carrier and the motherboard.

Furthermore, according to a third embodiment of the present invention another method for attachment and alignment of optical devices to a motherboard to compensate any arbitrary lateral and angular misalignment during the final mounting. This method is similar to the method in the second embodiment as described above, except the through holes are provided in the motherboard, and the plugs are inserted through the holes from the bottom of the motherboard.

Embodiments of the apparatus and methods for attachment and alignment of optical modules allow sufficient angular and lateral offset as the fixture secured to a motherboard. Furthermore, the methods of the present invention reduce the requirement of dimensional tolerances on parts or completely eliminate the need for precision spacers.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 1:
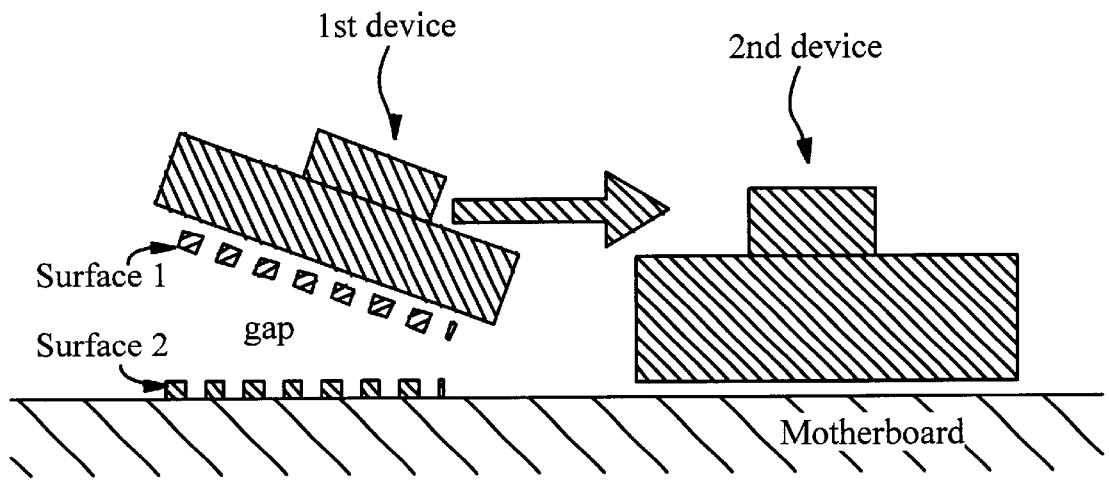
FIG. 1 is a schematic diagram illustrating a prior art assembly showing a gap formed between bonding surfaces during mounting an optical device to a motherboard.
Figure 2:
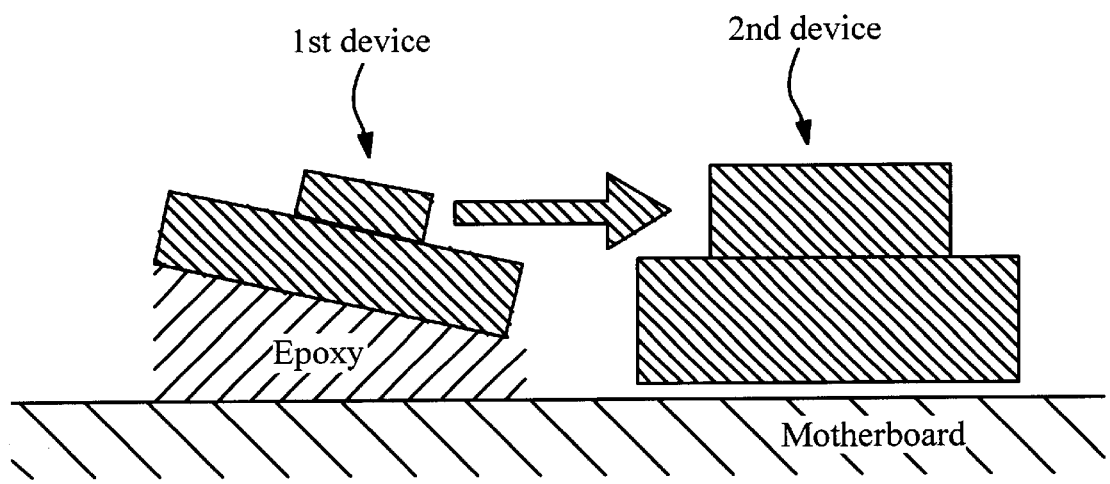
FIG. 2 is a schematic diagram illustrating a prior art showing an assembly method wherein the gap between bonding surfaces is filled with epoxy.
Figure 3:
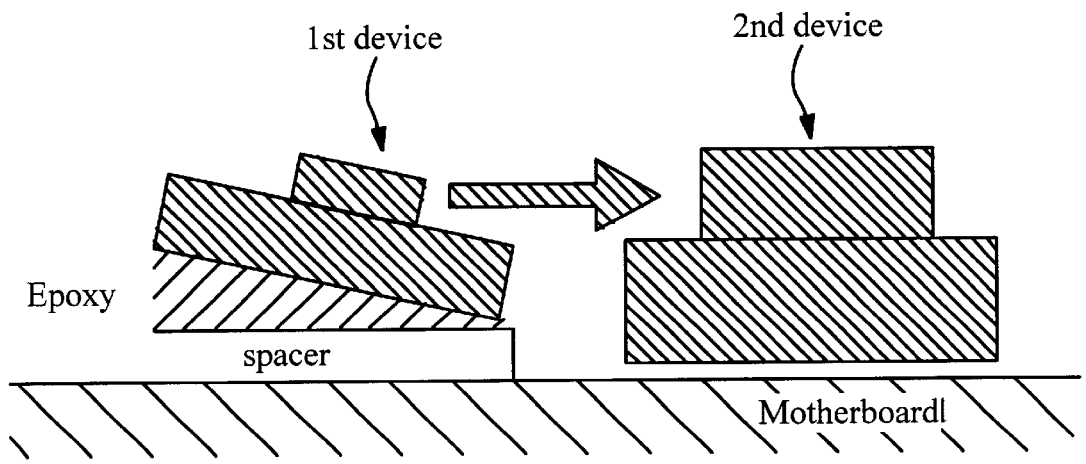
FIG. 3 is a schematic diagram of a prior art assembly showing a spacer used to reduce the overall gap between two bonding surfaces.
Figure 4:
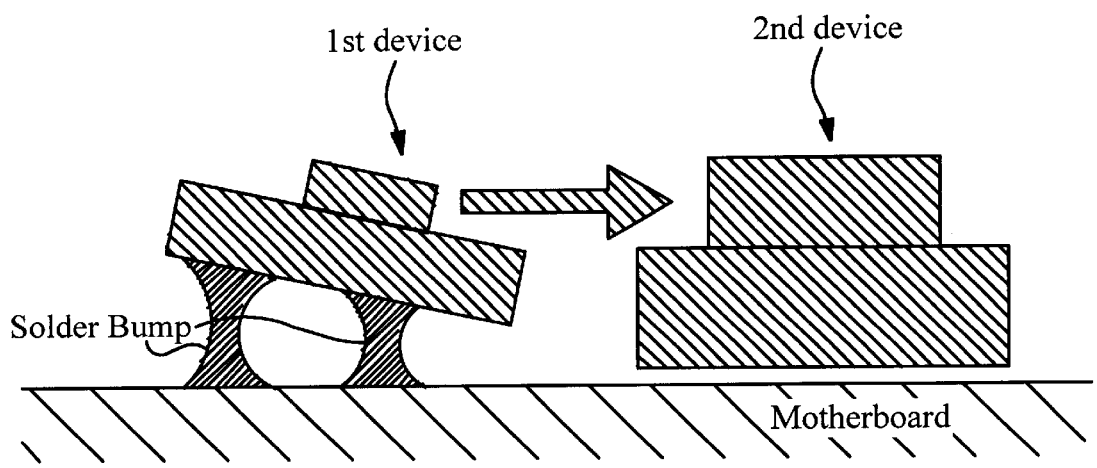
FIG. 4 is a schematic diagram illustrating a prior art assembly method wherein solder bump is used to bond two surfaces at high temperature.
Figure 5:
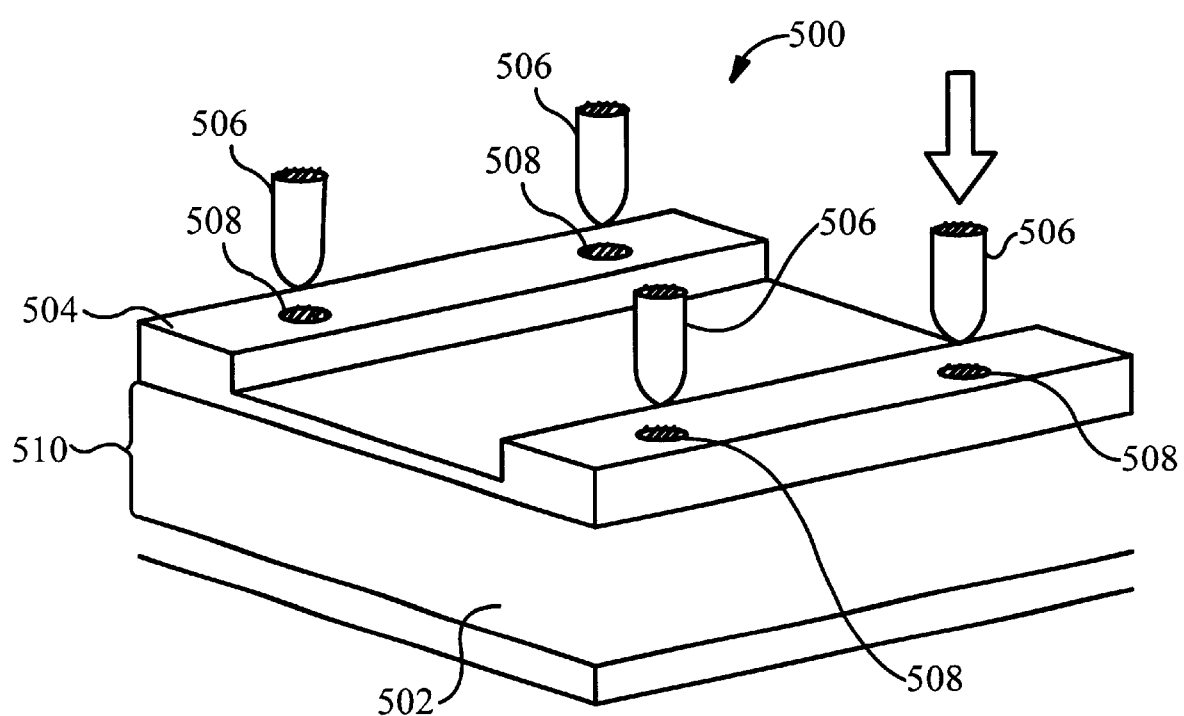
FIG. 5 is a schematic diagram of an apparatus for attachment and alignment of an optical device to a motherboard with the through holes provided in the device carrier according to a first embodiment of the present invention.

FIG. 5. shows a schematic diagram of an apparatus 500 for attachment and alignment of an optical device to a motherboard 502 according to a first embodiment of the present invention. The apparatus 500 generally comprises a device carrier 504 and adjustable plugs 506 used as a bridge connections between the motherboard 502 and the device carrier 504. The gap 510 between the device carrier 504 and the motherboard 502 is filled with a filler material such as epoxy or solder.

The device carrier 504 is typically made from a material with a low thermal expansion, which does not expand or contract much with temperature fluctuations, so overall thermal performance is enhanced. This material includes aluminum, ceramic, hardened steel, glass, or silicon. A device, such as a lens array, can be secured in device carrier 504 in a fixed position by any suitable means.

The plugs 506 are typically made from similar materials to those of the device carrier 504 as described above. Furthermore, to offer as an integral part to existing soldering technique, the plugs 506 could also be plated for soldering or are made from the soldering materials such as tin-lead and gold-tin. Generally, three or more plugs 506 are used to align the device carrier 504.

As shown in FIG. 5, the through holes 508 are provided on the device carrier 504. The cross-sections of the plugs 506 and through holes 508 are chosen to provide a maximum contact area between them such as square/square or round/round cross-sections. The plugs 506 are inserted into the through holes 508 from the top of the device carrier 504. The plugs 506 closely fit into the holes 508, so the clearance is large enough for the plugs 506 to slip through the holes 508 without much insertion force. However the clearance is generally small enough that the plugs 506 are held in place by the force of friction. The clearance between the plugs 506 and the holes 508 can be 50 $\mu$m or less, depending on the filler materials.

The device carrier 504 is aligned laterally and angularly by using the plugs as an adjustable spacer between the device carrier 504 and the motherboard 502. The plugs 506 then are tacked to the motherboard 502 to maintain the alignment of the device carrier 504. The plugs may also be tacked to the device carrier 504. Any suitable means, such as epoxy, solder, or laser welding, may be used to tack the plugs in place. The filler material, such as epoxy, fills the space 510 between the device carrier 504 and the motherboard 502. The filler material and the plugs 506 secure the device carrier 504 to the motherboard 502.

Figure 6:
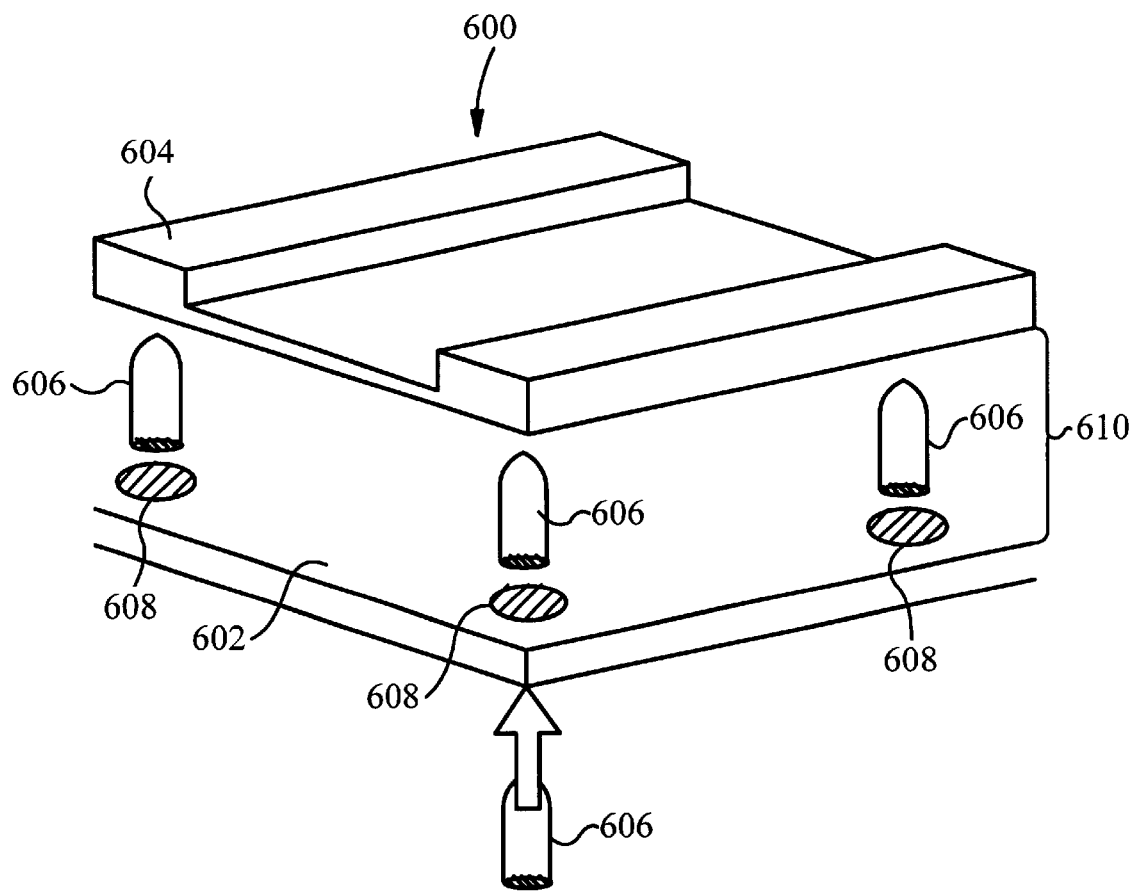
FIG. 6 is a schematic diagram of an apparatus for attachment and alignment of an optical device to a motherboard with the through holes provided in the motherboard according to a second embodiment of the present invention.

FIG. 6 shows a schematic diagram of an apparatus 600 for attachment and alignment of an optical device to a motherboard 602 according to a second embodiment of the present invention. The apparatus 600 comprises a device carrier 604 and three or more adjustable plugs 606 used as a bridge connection between the motherboard 602 and the device carrier 604. The gap 610 between the device carrier 604 and the motherboard 602 is filled with a filler material such as epoxy or solder.

The materials for the device carrier 604 and the plugs 606 are similar to the materials of the device carrier 504 and the plugs 506 describe above with respect to FIG. 5.

The method for attachment and alignment of optical devices to the motherboard applying to the apparatus 600 is similar to the method applying for the apparatus 500 as described above. The difference between the two methods is that the through holes 608 are provided on the motherboard 602, and the plugs 606 are inserted into the holes 608 from the bottom of the motherboard 602. The plugs 606 are tacked to the device carrier 604 and/or the motherboard 602 to secure the alignment of the device.

Figure 7:
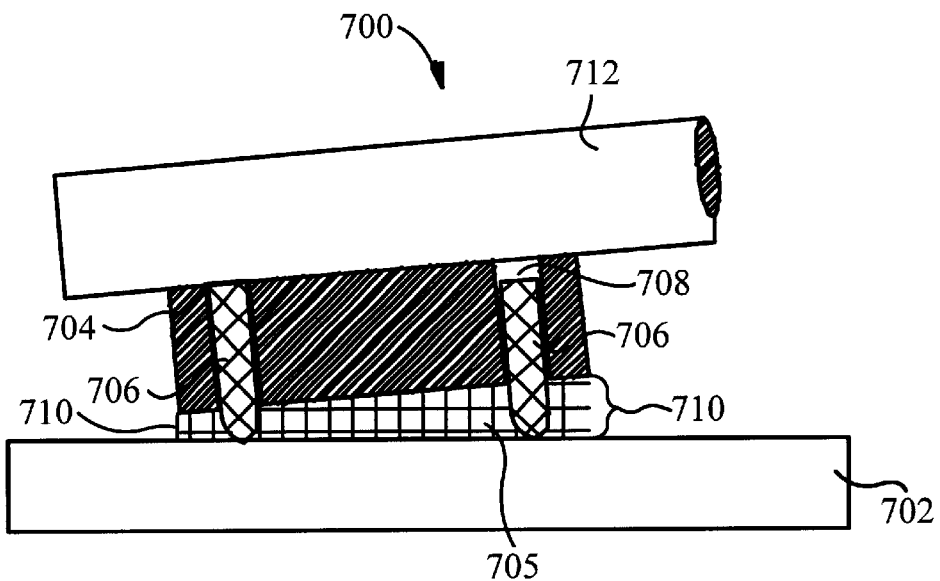
FIG. 7 is a cross-sectional schematic diagram showing the use of adjustable plugs as connection bridge between a device carrier and a motherboard according to an embodiment of the present invention.

A method of utilizing the plugs as a connection bridge between the device carrier and the motherboard described above is shown in cross-sectional diagram 700 in FIG. 7. In FIG. 7, an optical device 712, which is secured to a device carrier 704, is connected and aligned relative to a motherboard 702 by plugs 706. The plugs 706 are inserted into through holes 708, which are provided in the device carrier 704. A filler material 705, such as epoxy or solder, fills a gap 710 between the device carrier 704 and the motherboard 702. The plugs 706 can slip up and down in the through holes 708 during the movement of the device carrier 704 relative to the motherboard 702. The plugs 706 serve as an adjustable spacer between the device carrier 704 and the motherboard 702.

Figure 8:
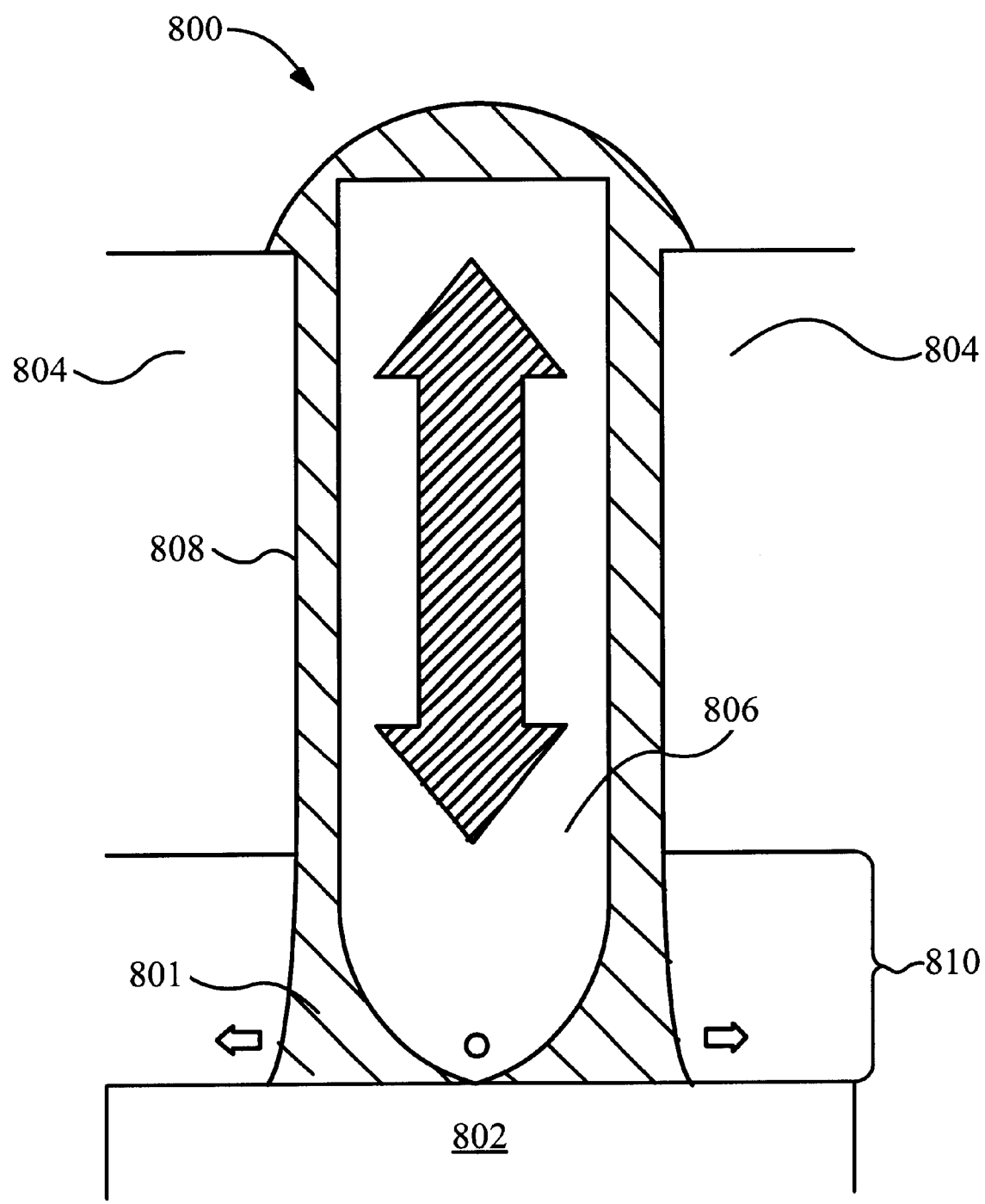
FIG. 8 is a cross-sectional schematic diagram of the joint structure according to an embodiment of the present invention.

FIG. 8 shows a cross-sectional diagram of a joint structure 800 between a device carrier and a plug, which are held together by a filler material 801 such as solder or epoxy. This diagram includes a motherboard 802, a device carrier 804, and a plug 806. The device carrier 804 is connected to the motherboard 802 by inserting the plug 806 into a through hole 808, which is provided in the device carrier 804. The plug 806 closely fit into the through hole 808, so the clearance is large enough for plug to slip through the hole 808 without much insertion force, yet small enough to hold the pin and device carrier together by friction. Through hole 808 is provided in the assembly to confine epoxy or solder at the joint 800 and form a channel to allow plug 806 to slide up and down during movement of the device carrier 804 relative to the motherboard 802. The clearance is exaggerated in FIG. 8 for the sake of clarity. The joint structure 800 allows maximum adhesive contact area between the device carrier 804 and the plug 806. After the device carrier 804 is aligned spatially and angularly, a filler material, such as solder or epoxy, fills the clearance between the plug 806 and the hole 808 and the gap 810 between the device carrier 804 and the motherboard 802 to secure the device carrier 804 to the motherboard 802.

It will be clear to one skilled in the art that the above embodiment may be altered in many ways without departing from the scope of the invention. Accordingly, the scope of the invention should be determined by the following claims and their legal equivalents.

What is claimed is:

1. An apparatus for attachment and alignment of optical devices to a motherboard comprising:
    a) at least one device carrier;
    b) at least three adjustable plugs configured to fit into openings in the device carrier or in the motherboard; and
    c) a filler material that fills the space between the device carrier and the motherboard.

2. The apparatus of claim 1, wherein the device carrier has one or more sides containing the openings.

3. The apparatus of claim 1, wherein the device carrier is made from a material with a low thermal expansion.

4. The apparatus of claim 3, wherein the device carrier is made from a material selected from the group consisting of aluminum, ceramic, hardened steel, glass, or silicon.

5. The apparatus of claim 1, wherein the plugs are in the form of pins or balls.

6. The apparatus of claim 1, wherein the plugs are made from a material with low thermal expansion.

7. The apparatus of claim 6, wherein the plugs are made from a material selected from the group consisting of aluminum, ceramic, hardened steel, glass, or silicon.

8. The apparatus of claim 1, wherein the plugs further comprise a soldering material for securing the device carrier.

9. The apparatus of claim 8, wherein the soldering material selected from the group consisting of tin-lead and gold-tin.

10. The apparatus of claim 1, wherein the plugs are plated for soldering.

11. The apparatus of claim 1, wherein the plugs have shapes that provide maximum contact area.

12. The apparatus of claim 11, wherein the plugs have round shape.

13. The apparatus of the claim 11, wherein the plugs have square shape.

14. The apparatus of claim 1, wherein the filler material is selected from the group consisting of epoxy and solder.

15. A method for attachment and alignment of optical devices to a motherboard comprising the steps of:
    a) providing a device carrier having at least three through holes;
    b) inserting a plug into each of at least three through holes;
    c) securing a device to the device carrier;
    d) aligning the device carrier spatially and angularly to align the device;
    e) tacking the plugs to maintain an alignment of the device carrier; and
    f) filling the space between the device carrier and the motherboard by a filler material.

16. The method of claim 15, wherein the plugs closely-fit into the holes.

17. The method of claim 15, wherein the plugs can slip up and down through the holes during movement of the device carrier relative to the motherboard.

18. The method of claim 15, wherein the plugs are used as an adjustable spacer between the device carrier and the motherboard.

19. The method of claim 15, wherein the filler material and plugs secure the device carrier to the motherboard.

20. The method of claim 15, wherein the adhesive is confined and evenly distributed around the plugs, so that horizontal stresses on the adhesive in the space between the device carrier and the motherboard are equally cancelled out.

21. A method for attachment and alignment of optical devices to a motherboard comprising the steps of:
    a) providing at least three through holes in the motherboard;
    b) inserting a plug into each of at least three through holes;
    c) securing a device to a device carrier;
    d) aligning the device carrier spatially and angularly to align the device;
    e) tacking the plugs to maintain an alignment of the device carrier; and
    f) filling the space between the device carrier and the motherboard by a filler material.

22. The method of claim 21, wherein the plugs closely-fit into the holes.

23. The method of claim 21, wherein the plugs can slip up and down through the holes during movement of the device carrier relative to the motherboard.

24. The method of claim 21, wherein the plugs are used as an adjustable spacer between the device carrier and the motherboard.

25. The method of claim 21, wherein the filler material and plugs secure the device carrier to the motherboard.

26. The method of claim 21, wherein the adhesive is confined and evenly distributed around the plugs, so that horizontal stresses on the adhesive in the space between the device carrier and the motherboard are equally cancelled out.

* * * * *